(12) United States Patent
Orita

(10) Patent No.: US 6,586,301 B2
(45) Date of Patent: Jul. 1, 2003

(54) METHOD OF FABRICATING EEPROM HAVING TUNNEL WINDOW AREA

(75) Inventor: Toshiyuki Orita, Kanagawa (JP)

(73) Assignee: Oki Electric Industry Co, Ltd., Tokyo (JP)

( * ) Notice: Subject to any disclaimer, the term of this patent is extended or adjusted under 35 U.S.C. 154(b) by 91 days.

(21) Appl. No.: 09/736,377

(22) Filed: Dec. 15, 2000

(65) Prior Publication Data

US 2002/0037640 A1 Mar. 28, 2002

(30) Foreign Application Priority Data

Sep. 22, 2000 (JP) ........................................ 2000-288448

(51) Int. Cl.[7] ............................................. H01L 21/336
(52) U.S. Cl. ...................... 438/257; 438/264; 438/594; 438/705; 438/770; 438/981
(58) Field of Search ................................ 438/257, 263, 438/264, 594, 714, 770, 981, 705

(56) References Cited

U.S. PATENT DOCUMENTS

| | | | |
|---|---|---|---|
| 4,931,847 A | 6/1990 | Corda | 365/185.28 |
| 5,379,253 A | 1/1995 | Bergemont | 365/185.02 |
| 5,637,520 A * | 6/1997 | Cappelletti et al. | 438/258 |
| 6,027,972 A | 2/2000 | Kerber | 438/257 |
| 6,096,604 A * | 8/2000 | Cha et al. | 438/259 |

* cited by examiner

*Primary Examiner*—Amir Zarabian
*Assistant Examiner*—Toniae M. Thomas
(74) *Attorney, Agent, or Firm*—Rabin & Berdo, P.C.

(57) ABSTRACT

Heavily concentrated impurities are selectively introduced into a portion outside a polysilicon region of a region of a tunnel window area of an EEPROM memory cell, a polysilicon portion where impurities are not introduced is selectively etched, and then a tunnel oxide film is formed in a tunnel window area by oxidizing residual polysilicon.

2 Claims, 3 Drawing Sheets

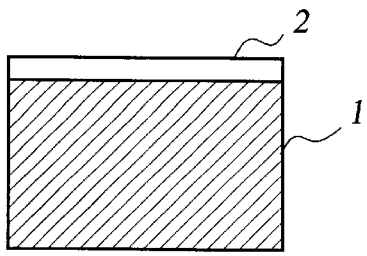
FIG.1A
PRIOR ART
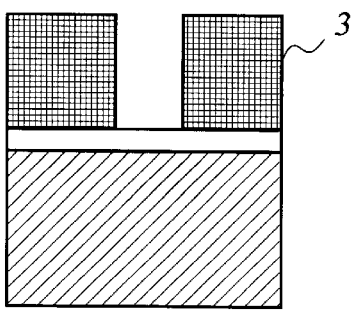
FIG.1B
PRIOR ART
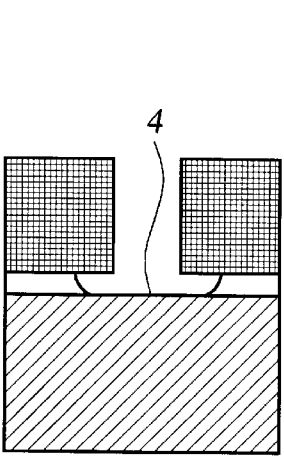
FIG.1C
PRIOR ART
FIG.1D
PRIOR ART
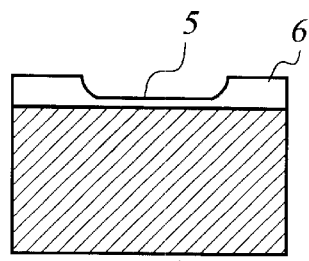
FIG.1E
PRIOR ART
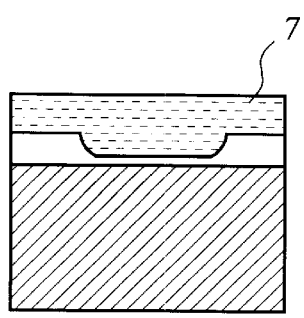
FIG.1F
PRIOR ART
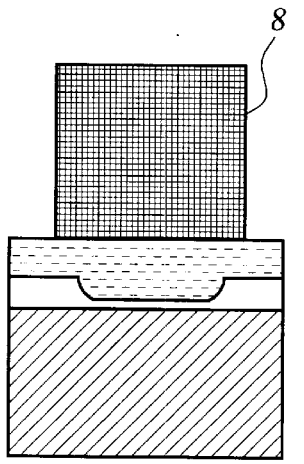
FIG.1G
PRIOR ART
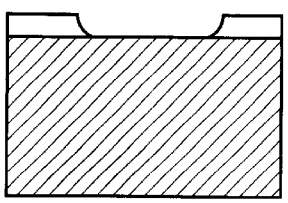
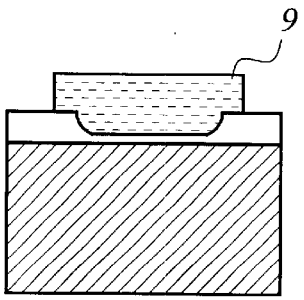
FIG.1H
PRIOR ART

METHOD OF FABRICATING EEPROM HAVING TUNNEL WINDOW AREA

BACKGROUND OF THE INVENTION

1. Field of the Invention

The present invention relates to a method of fabricating a nonvolatile semiconductor memory that includes a floating gate electrode and a control gate electrode and performs tunnel injection and erasure using a tunnel window area as a local thin oxide area.

2. Description of Related Art

Conventionally, there has been a rewriting data device that carries electrons through a tunneling phenomenon between a floating electrode and a diffusion layer formed on a substrate through a thin gate oxide film (tunnel oxide film) called a tunnel window area that has an opening on the diffusion layer in an electrically programmable/erasable read only memory (EEPROM) including a floating gate electrode and a control gate electrode.

Here, for a method of fabricating the above-mentioned EEPROM, a method of forming the tunnel window area in an EEPROM cell portion is chiefly explained with respect to FIGS. 1A–1H. An oxide film 2, the thickness of which is 200 Angstroms, for example, is formed on a p-type silicon (Si) substrate 1, and then a window opening 4 is formed by wet-etching a part of the oxide film 2 using a solvent such as hydrofluoric acid using a resist 3 as a mask (FIGS. 1A to 1C).

Subsequently, the resist 3 is removed by an ashing process, the oxide film 2 is oxidized again, and a gate oxide film 6, which has a locally thinned tunnel oxide film 5 that has a thickness of about 100 Angstroms, is locally formed in the window opening 4 (FIGS. ID and IE). Then, after polysilicon 7 as the floating electrode is deposited, polysilicon 7 is etched using a resist 8 as a mask, and a floating gate electrode 9 is formed so as to cover the window opening 4 (FIGS. 1F to 1H).

In accordance with the disclosed conventional method, in view of any etching damage, etc., performing a wet-etching process forms a tunnel window opening. However, in the wet-etching process, there have been problems including seeping of, or side etching by the etching solvent, and furthermore there have been problems where it has been difficult to form a very small tunnel window opening.

SUMMARY OF THE INVENTION

It is a primary object of this invention to provide a method of avoiding seeping or side etching of etching solvent and to form a very small tunnel window opening.

Here, all of the necessary characteristics which the— present invention requires are not disclosed in the summary of the invention, but sub-combinations of these characteristics can also be the present invention.

The present invention is a method for fabricating an MOS transistor which includes a floating gate electrode and a film portion for a tunnel injection into the floating electrode, including a forming process for forming a first oxide film and a further first polysilicon layer on a semiconductor substrate; an introducing process for selectively introducing BF2 ions to a polysilicon portion outside a region of the film portion; an etching process for selectively etching polysilicon on the portion of the film where BF2 ions are not implanted; an oxidation process for oxidizing all of the polysilicon remaining after performing the etching process on an oxide film; and a polysilicon forming process for forming polysilicon as a floating gate electrode in a portion including a region of the film. The etching process is a wet etching process using a mixed solvent of hydrofluoric acid, nitric acid, and acetic acid.

The present invention is a method for fabricating an MOS transistor which includes a floating gate electrode and a film portion for a tunnel injection into the floating electrode including a forming process for forming a first oxide film on a semiconductor substrate; an introducing process for selectively introducing heavily concentrated impurities into a region of the film of the oxide film; an etching process for selectively etching the oxide film of the portion of the film where the heavily concentrated impurities are introduced; a forming process for performing an oxidizing process and forming an oxide film on the film; and a polysilicon forming process for forming polysilicon as a floating gate electrode in a portion including a region of the film. The heavily concentrated impurities are arsenic and hydrofluoric acid. The etching process is a wet-etching process using a hydrofluoric acid solvent. The etching process is a dry-etching process using a mixed gas of CF4 and O2.

The present invention selectively introduces heavily concentrated impurities into a portion outside a polysilicon region of a region of a tunnel window area, a polysilicon portion where impurities are not introduced is selectively etched, and then a tunnel oxide film is formed in the tunnel window area by oxidizing residual polysilicon.

Furthermore, the present invention selectively introduces heavily concentrated impurities into the region of the tunnel window area after the oxide film is formed, and it becomes possible to form the tunnel oxide film in the tunnel window area by selectively etching the oxide film where impurities are introduced and then wholly oxidizing. As a result, according to the present invention, it is possible to control the diameter of the tunnel window area in an easy manner, and thus it is possible to form a very small EEPROM memory cell.

BRIEF DESCRIPTION OF THE DRAWINGS

While the specification concludes with claims particularly pointing out and distinctly claiming the subject matter which is regarded as the invention, it is believed that the invention, the object, features and advantages thereof will be better understood from the following description taken in connection with the accompanying drawings in which:

FIGS. 1A to 1H are process flows that explain the tunnel window area forming technology of the conventional EEPROM memory cell;

DETAILED DESCRIPTION OF THE INVENTION

While particular embodiments of the present invention have been described and illustrated, it should be understood that the invention is not limited thereto since modifications may be made by persons skilled in the art. The present application contemplates any and all modifications that fall within the spirit and scope of the underlying invention described and claimed herein.

Figure 2A:
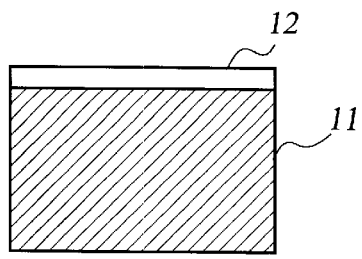
FIGS. 2A to 2J are process flows of the tunnel window area forming technology of an EEPROM memory cell that explain the first preferred embodiment of the present invention.
Figure 2F:
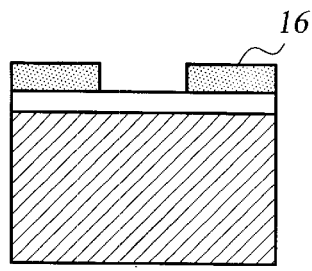
Figure 2B:
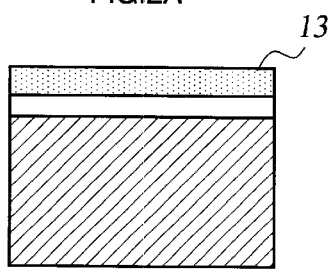

First of all, the first preferred embodiment of the present invention is explained with reference to FIGS. 2A–2J. After an oxide film 12, the thickness of which is 2000 Angstroms, is deposited on a P type silicon (Si) substrate 11 and polysilicon 13, the thickness of which is 1000 Angstroms, is deposited thereon, BF2 ions, the dosing quantity of which is about $1\times10^{15}$ cm$^{-2}$ ($1\times10^2$ cm$^{-3}$), are implanted using a resist 14 (FIGS. 2A to 2D). After the resist 14 is removed, non-doped polysilicon 15, where BF2 ions are not implanted, is selectively removed (FIGS. 2E to 2F).

At this etching stage, a mixed solvent, HF:HN03 I CH 3 COOH=1:115:6, is used. By using the solvent thereof, the non-ion-doped polysilicon 15 is capable of being selectively etched, and further side etching is not caused because it has a superior selective quality.

Figure 2G:
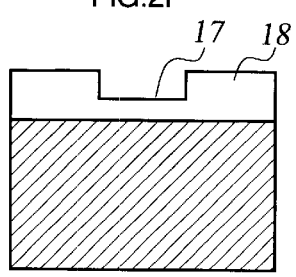
Figure 2C:
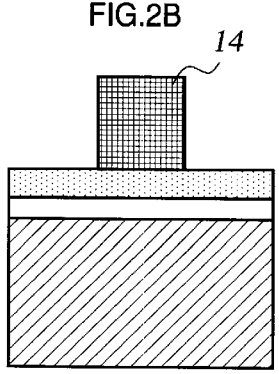
Figure 2H:
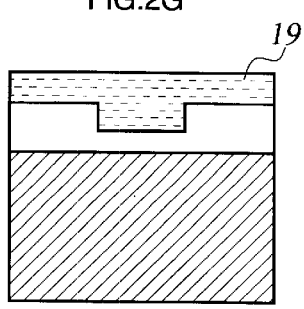
Figure 2D:
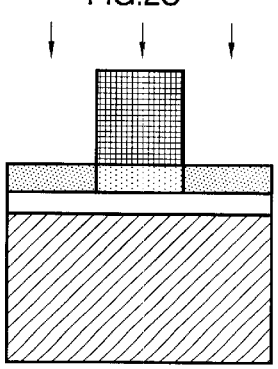
Figure 2I:
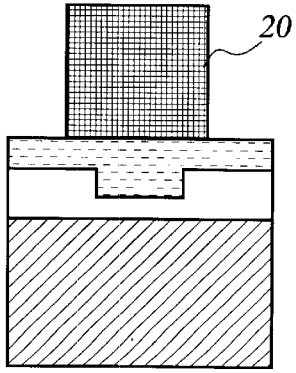
Figure 2E:
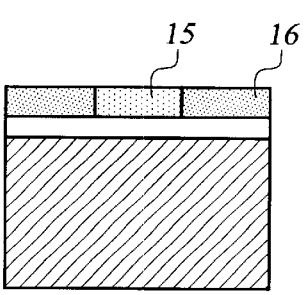
Figure 2J:
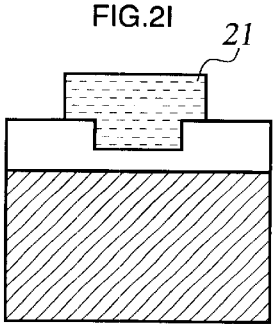

Next, a gate oxide film 18 that has a local thin film in a tunnel window area 17 is formed by changing all of the doped polysilicon 16 to an oxide film using a thermal oxidation process (FIG. 2G). Successively, polysilicon 19 is deposited and a patterning process is performed using a resist 20, so that a floating gate electrode 21 is formed on the tunnel window area 17 (FIGS. 2H to 2J).

As already explained in the foregoing, according to the first preferred embodiment, since BF2 ions are selectively implanted into polysilicon and a portion where BF2 ions are doped is selectively wet-etched, it becomes possible to easily form a very small tunnel window area pattern.

Figure 3A:
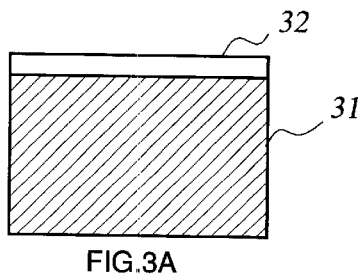
FIGS. 3A to 3I are process flows of the tunnel window area forming technology of an EEPROM memory cell that explain the second preferred embodiment of the present invention.

The second preferred embodiment of the present invention is explained with reference to FIGS. 3A–3I. An oxide film 32, the thickness of which is 200 Angstroms, is formed on a P-type silicon (Si) substrate 31, and then covered by a resist layer 33, which is patterned to form an opening that exposes an area of the oxide film. Arsenic (As) ions are then implanted through the opening in a resist layer 33 to form a doped portion 34 of the oxide film 32 where the oxide film layer is not covered by the resist (FIGS. 3A to 3C). The doped portion 34 is wet-etched using a solvent such as hydrofluoric acid (FIG. 3D).

The etching rate of the oxide film 32 where As ions are implanted becomes exceedingly larger compared to the portion where As ions are not implanted. When the quantity of doses is about $2\times10^{14}$ cm$^{-2}$ ($1\times10^{20}$ cm$^{-3}$), the etching rate becomes 5 times its rate. Thus, the quantity of side etching is suppressed to $\frac{1}{5}$ to that of the conventional method.

Figure 3F:
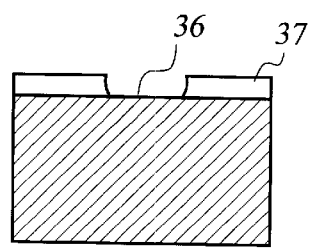
Figure 3B:
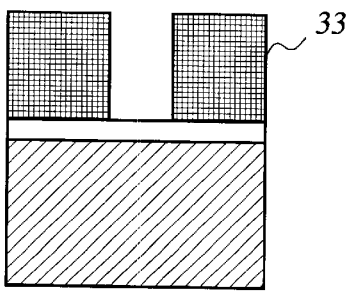
Figure 3G:
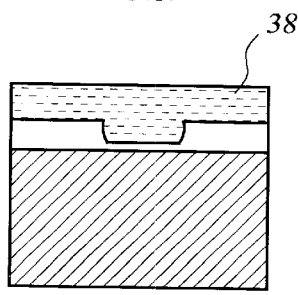
Figure 3C:
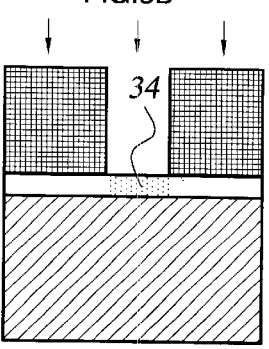
Figure 3H:
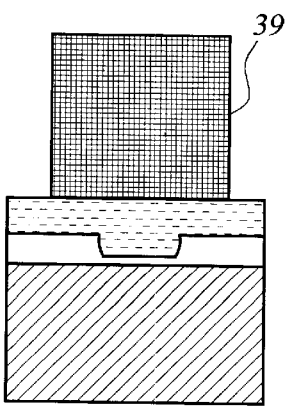
Figure 3D:
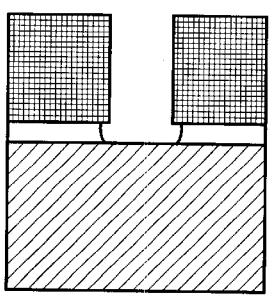
Figure 3I:
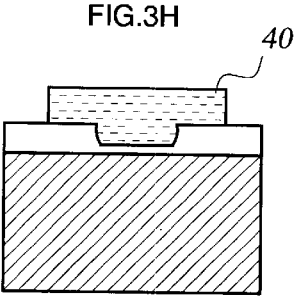
Figure 3E:
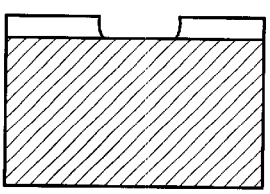

Successively, the resist layer 33 is removed using an ashing process, the whole face is oxidized, and then a gate oxide film 37 that has a tunnel oxide film 36 is formed (FIGS. 3E to 3F). Next, a floating gate electrode 40 is formed by depositing polysilicon 38 and patterning using a resist 39 over an area that includes where the wet etching was performed.

As explained in the foregoing, in accordance with the second preferred embodiment, it becomes possible to suppress side etching in a portion where As ions are not implanted by increasing the etching rate by selectively implanting As ions into the portion of the oxide film that is wet-etched. Thus, it becomes possible to form the tunnel window on a very small pattern.

Next, the third preferred embodiment is explained herein. This is the embodiment where fluorine (F) ions, the dosing quantity of which is $2\times10^{14}$ cm$^{-2}$ ($1\times10^{20}$ cm$^{-3}$), are implanted instead of As ions used in the second preferred embodiment. In this case, in order to selectively etch the oxide film where F ions are implanted, a plasma etching process is performed.

For example, if the etching process, in which the pressure is 130 Pa and the RF power is 250 W using a mixed, (3:1), gas of CF4 and O2, is performed using an anode couple RIE device, the portion of the oxidized film where F ions are not implanted is not etched.

It becomes possible to suppress side etching of the portion where F ions are not implanted by selectively heightening the etching rate of the portion of the oxide film where the etching process is performed in the same way as the second preferred embodiment of the present invention, thus it becomes possible to form the tunnel window on a very small pattern.

As explained in the foregoing, since a selective etching process, in which side etching is not caused, is performed to the opening when the tunnel window opening is formed, the tunnel window opening is capable of being formed in a precise manner. Thus, it becomes possible to easily form a very small EEPROM memory cell.

What is claimed is:

1. A method for fabricating an MOS transistor which includes a floating gate electrode and a thin film area for injection of a tunneling current into the floating electrode, comprising:

forming a first oxide film and also a first polysilicon layer on a semiconductor substrate;

selectively introducing BF2 ions to a polysilicon portion outside a region of the thin film area;

selectively etching said polysilicon of the portion of the film where BF2 ions are not implanted;

oxidizing all of said polysilicon that remains after said selectively etching; and forming polysilicon as a floating gate electrode in a portion including a region of the film.

2. A method for fabricating an MOS transistor according to claim 1, wherein said selectively etching is a wet etching process that uses a mixed solvent of hydrofluoric acid, nitric acid, and acetic acid.

* * * * *